(12) United States Patent
Phillips et al.

(10) Patent No.: US 7,142,053 B2
(45) Date of Patent: Nov. 28, 2006

(54) VOLTAGE CLAMP FOR IMPROVED TRANSIENT PERFORMANCE OF A COLLECTOR VOLTAGE CONTROLLED POWER AMPLIFIER

(75) Inventors: Kerry B. Phillips, Cedar Rapids, IA (US); David S. Ripley, Cedar Rapids, IA (US); Robert M. Fisher, Center Point, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 62 days.

(21) Appl. No.: 11/006,233

(22) Filed: Dec. 6, 2004

(65) Prior Publication Data

US 2006/0119425 A1    Jun. 8, 2006

(51) Int. Cl.
*H03F 1/14* (2006.01)

(52) U.S. Cl. .................. 330/51; 330/136; 330/285; 330/297

(58) Field of Classification Search ................ 330/51, 330/136, 285, 297

See application file for complete search history.

(56) References Cited

U.S. PATENT DOCUMENTS

| 4,987,385 | A  | * | 1/1991 | Engelmann ................ 330/297 |
| 5,625,893 | A  | * | 4/1997 | Kahn ........................ 455/70 |
| 6,242,975 | B1 | * | 6/2001 | Eidson et al. ........... 330/124 R |
| 6,727,754 | B1 | * | 4/2004 | Dupuis et al. ............. 330/254 |
| 6,947,713 | B1 | * | 9/2005 | Checoury et al. .......... 455/126 |
| 6,982,593 | B1 | * | 1/2006 | Robinson et al. ............ 330/10 |

* cited by examiner

*Primary Examiner*—Patricia Nguyen

(57) ABSTRACT

A power control circuit for a power amplifier comprises a voltage regulator having a first input configured to receive an envelope control signal, a second input configured to receive a feedback signal, and a third input configured to receive a voltage clamp signal; and a clamp voltage reference circuit configured to generate the voltage clamp signal.

25 Claims, 7 Drawing Sheets

VOLTAGE CLAMP FOR IMPROVED TRANSIENT PERFORMANCE OF A COLLECTOR VOLTAGE CONTROLLED POWER AMPLIFIER

BACKGROUND OF THE INVENTION

1. Field of the Invention

This invention relates generally to power amplifier control. More particularly, the invention relates to a voltage clamp for improving the transient response of a collector voltage controlled power amplifier.

2. Related Art

With the increasing availability of efficient, low cost electronic modules, portable communication devices are becoming more and more widespread. A portable communication device includes one or more power amplifiers for amplifying the power of the signal to be transmitted from the portable communication device. In a collector voltage controlled power amplifier (PA), the output power is determined by a regulated voltage applied to the collector of a bi-polar junction transistor (or drain, if implemented as a field effect transistor (FET)) of one or more stages of the power amplifier. Ideally, this voltage is referred to as $V_{CC}$ and should closely follow (also referred to as "track") an input voltage envelope control signal (referred to as $V_{ENV}$), according to a transfer function defined as $V_{CC}=H(V_{ENV})$. The voltage $V_{ENV}$ controls the power amplifier as a function of the peak voltage of the power amplifier determined during calibration, and corresponds to power amplifier output power.

Typically, a power amplifier requires a relatively large current source. To source this large current with minimal voltage drop from the power source (e.g., a battery having voltage $V_{BATT}$) to the collector of the power amplifier, a relatively large transistor (typically a field effect transistor (FET)) is used as the output device of the voltage regulator. As current flows from the battery, the battery voltage falls to a value below the desired collector voltage of the power amplifier as determined by $H(V_{ENV})$. Under this condition, the voltage ($V_{DS}$) across the drain and source terminals of the FET at the output of the voltage regulator is too small to maintain saturation of the FET and the voltage at the collector terminal of the power amplifier ($V_{CC}$) is no longer determined by the voltage regulator, but rather by the battery voltage, $V_{BATT}$. Typically, the transition from this unregulated condition back to a regulated condition (when $V_{CC}$ is reduced sufficiently below $V_{BATT}$) is abrupt, also referred to as "switching transients," leading to undesirable spectral components, referred to as spectral regrowth. Spectral regrowth can cause interference to other portable communication devices operating in adjacent frequency bands.

Therefore, it would be desirable to control the voltage applied to the collector of a power amplifier so that there are no abrupt transitions, thereby minimizing spectral regrowth due to switching transients.

SUMMARY

Embodiments of the invention include a power control circuit for a power amplifier comprising a voltage regulator having a first input configured to receive an envelope control signal, a second input configured to receive a feedback signal, and a third input configured to receive a voltage clamp signal, and a voltage clamp reference circuit configured to generate the voltage clamp signal.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the power amplifier control element can be implemented in any communication device employing a collector voltage controlled power amplifier.

The power amplifier control element can be implemented in hardware, software, or a combination of hardware and software. When implemented in hardware, the power amplifier control element can be implemented using specialized hardware elements and logic. When the power amplifier control element is implemented partially in software, the software portion can be used to control the power amplifier control components so that various operating aspects can be software-controlled. The software can be stored in a memory and executed by a suitable instruction execution system (microprocessor). The hardware implementation of the power control element can include any or a combination of the following technologies, which are all well known in the art: discreet electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the power amplifier control element comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
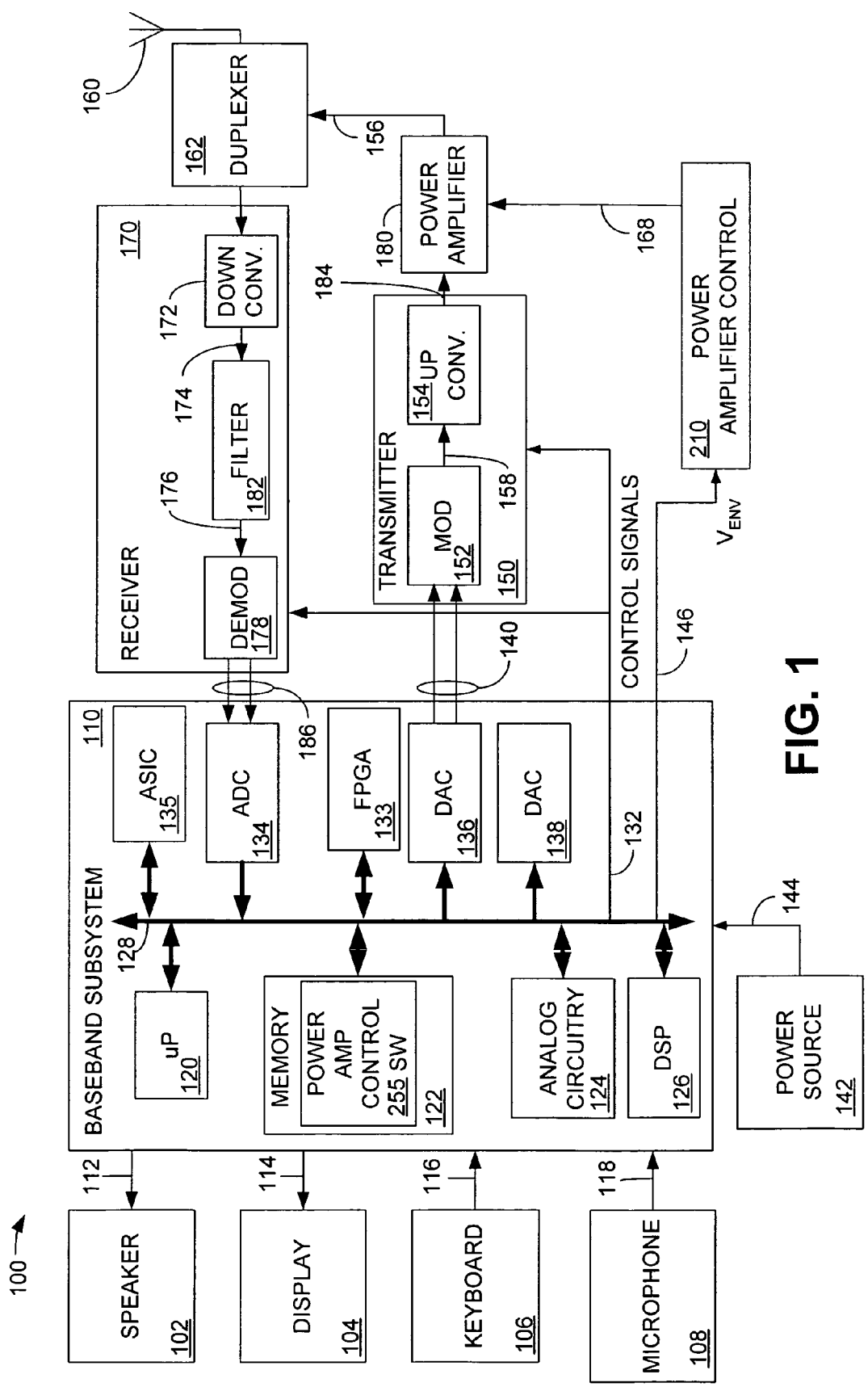
FIG. 1 is a block diagram illustrating a simplified portable transceiver including a power amplifier control element according to one embodiment of the invention.

FIG. 1 is a block diagram illustrating a simplified portable transceiver 100 including a power amplifier control element having a voltage regulator in accordance with an embodiment of the invention. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the power control element is implemented, the baseband subsystem 110 may also include an application specific integrated circuit (ASIC) 135 and /or a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150 and receiver 170 via connection 132 and provides an envelope control signal, referred to as $V_{ENV}$, to a power amplifier control module 210 via connection 146. The signal $V_{ENV}$ is generated by the baseband subsystem 110 and is generally converted to an analog control signal by one of the digital-to-analog converters (DACs) 136 or 138 to be described below. The signal $V_{ENV}$ is illustrated as being supplied from the bus 128 to indicate that the signal may be generated in different ways as known to those skilled in the art. Generally, the voltage $V_{ENV}$ controls the power amplifier as a function of the peak voltage of the power amplifier determined during calibration, and corresponds to power amplifier output power.

The control signals on connections 132 and 146 may originate from the DSP 126, the ASIC 135, the FPGA 133, or from microprocessor 120, and are supplied to a variety of connections within the transmitter 150, receiver 170 and the power amplifier control module 210. It should be noted that, for simplicity, only the basic components of portable transceiver 100 are illustrated herein. The control signals provided by the baseband subsystem 110 control the various components within the transmitter 150 and the receiver 170. Further, the function of the transmitter 150 and the receiver 170 may be integrated into a transceiver.

If portions of the power amplifier control module 210 are implemented in software that is executed by the microprocessor 120, the memory 122 will also include power amplifier control software 255. The power amplifier control software 255 comprises one or more executable code segments that can be stored in the memory and executed in the microprocessor 120. Alternatively, the functionality of the power amplifier control software 255 can be coded into the ASIC 135 or can be executed by the FPGA 133, or another device. Because the memory 122 can be rewritable and because the FPGA 133 is reprogrammable, updates to the power amplifier control software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

Figure 2:
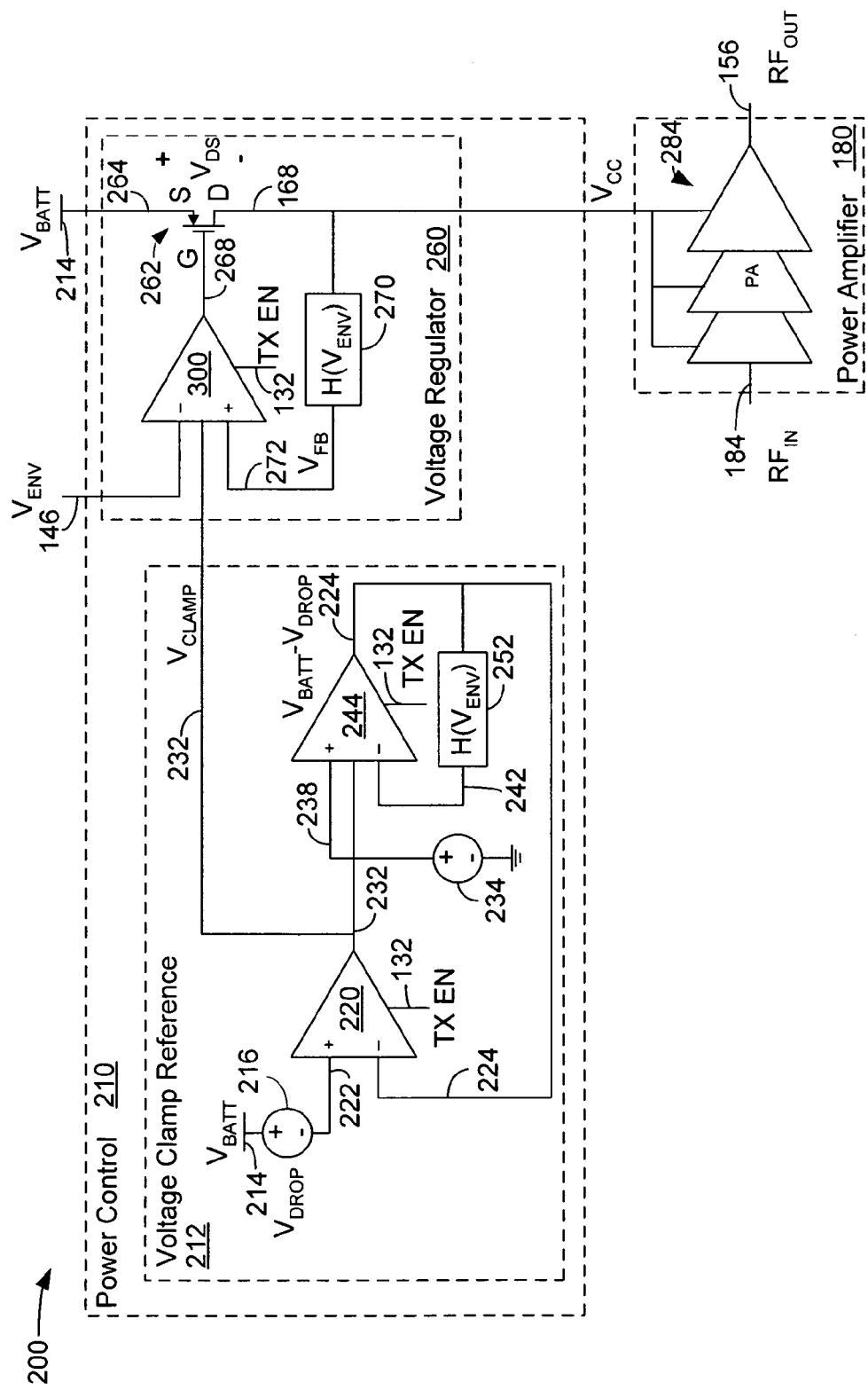
FIG. 2 is a block diagram illustrating a power amplifier module including the power amplifier control module of FIG. 1.

The transmitter 150 includes modulator 152, which modulates the analog information on connection 140 and provides a modulated signal via connection 158 to upconverter 154. The upconverter 154 transforms the modulated signal on connection 158 to an appropriate transmit frequency and provides the upconverted signal to a power amplifier 180 via connection 184. The power amplifier 180 and the power amplifier control module 210 form a power amplifier module 200 (FIG. 2). The power amplifier 180 amplifies the signal to an appropriate power level for the system in which the portable transceiver 100 is designed to operate.

Details of the modulator 152 and the upconverter 154 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. For example, when the power amplifier module is used in a constant-amplitude, phase (or frequency) modulation application such as the global system for mobile communications (GSM), the phase modulated information is provided by the modulator 152. When the power amplifier module is used in an application requiring both phase and amplitude modulation such as, for example, extended data rates for GSM evolution, referred to as EDGE, the Cartesian in-phase (I) and quadrature (Q) components of the transmit signal are converted to their polar counterparts, amplitude and phase. The phase modulation is performed by the modulator 152, while the amplitude modulation is performed by the power control module 210, where the amplitude envelope is defined by the voltage $V_{ENV}$, and the instantaneous power level of the power amplifier module 180 tracks $V_{ENV}$, thus generating a transmit signal with both phase and amplitude components. This technique, known as polar modulation, eliminates the need for linear amplification by the power amplifier module, allowing the use of a more efficient saturated mode of operation while providing both phase and amplitude modulation.

The power amplifier 180 supplies the amplified signal via connection 156 to duplexer 162. The duplexer comprises a filter pair that allows simultaneous passage of both transmit signals and receive signals, as known to those having ordinary skill in the art. The transmit signal is supplied from the duplexer 162 to the antenna 160.

Using the envelope control signal, $V_{ENV}$, received via connection 146, the power amplifier control module 210 determines the appropriate power level at which the power amplifier operates to amplify the transmit signal. The envelope control signal, $V_{ENV}$, is also used to provide envelope, or amplitude, modulation when required by the modulation standard. The power amplifier control module 210 includes a voltage regulator and a voltage clamp reference element, to be described below. The power amplifier control module 210 also provides a regulated collector voltage (referred to as $V_{CC}$) to the power amplifier 180 via connection 168, which determines the output of the power amplifier. The power amplifier control module 210 will be described in greater detail below.

A signal received by antenna 160 will be directed from the duplexer 162 to the receiver 170. The receiver 170 includes a downconverter 172, a filter 182, and a demodulator 178. If implemented using a direct conversion receiver (DCR), the downconverter 172 converts the received signal from an RF level to a baseband level (DC). Alternatively, the received RF signal may be downconverted to an intermediate frequency (IF) signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

FIG. 2 is a block diagram illustrating a power amplifier module 200 including an embodiment of the power amplifier control module 210 of FIG. 1. The power amplifier module 200 comprises a power amplifier control module 210, a voltage regulator 260, and the power amplifier 180 of FIG. 1. The power amplifier 180 comprises, in this example, multiple stages of power amplifier modules, indicated collectively at 284. In this example, the power amplifier stages are arranged in series. A radio frequency input signal ($RF_{IN}$) is supplied via connection 184 and the radio frequency output signal ($RF_{OUT}$) is supplied via connection 156. Similarly, the signal on connection 156 is an amplified version of the signal on connection 184. In accordance with an embodiment of the invention, the level of the input signal on connection 184 is not proportionally related to the level of the output signal on connection 156. In this embodiment, the power amplifier 180 is controlled by a reference signal supplied from the voltage regulator 260 on connection 168.

The power amplifier control module 210 comprises a linear voltage regulator 260 and a voltage clamp reference circuit 212. In this embodiment, the voltage clamp reference circuit 212 resides on the same die as the voltage regulator. However, in other embodiments, the voltage clamp reference signal can be supplied by other on-chip circuitry, or from a digital-to-analog converter (DAC) located in the baseband.

The power amplifier modules 284 within the power amplifier 180 are operated in a saturated mode, where the output power is not linearly related to the input power. When properly biased for saturated operation, the output power at connection 156 is related to the $V_{CC}$ signal on connection 168 according to equation 1, where $V_{CE(sat)}$ is the saturation voltage of the transistors within the power amplifier 180 and $R_L$ is the load impedance presented to the power amplifier 180 by matching networks (not shown).

$$P_O = \frac{(2V_{CC} - V_{CE(sat)})^2}{8R_L} \tag{Eq. 1}$$

The voltage regulator 260 includes an operational amplifier (op amp) 300, a p-type field effect transistor (PFET) 262, although other types of transistors could be used, and a feedback network 270 having the transfer function $H(V_{ENV})$. Since the power amplifier control module 210 can also be used to provide amplitude modulation, the bandwidth of the voltage regulator 260 is preferably sufficient to support the envelope bandwidth of the modulated signal. Also, to support amplitude modulation with a reduced $V_{BATT}$, the voltage clamp reference circuit 212 should maintain the effective bandwidth of the voltage regulator 260 at or above the envelope bandwidth of the desired modulated signal. The inverting input of the operational amplifier 300 is coupled to the baseband subsystem 110 (FIG. 1) via connection 146 and receives the envelope control signal $V_{ENV}$ from the digital-to-analog converter (DAC) of FIG. 1. The non-inverting input of the operational amplifier 300 receives the output ($V_{FB}$) of the feedback network 270 via connection 272. The output of the operational amplifier 300 is supplied via connection 268 to the gate terminal of the transistor 262. The source terminal 264 of the transistor 262 is coupled to battery voltage $V_{BATT}$ on connection 214. The drain terminal of the transistor 262 provides the output of the voltage regulator 260 on connection 168 to the collector terminal of the power amplifier 180. The output of the drain terminal 168 is also supplied as input to the feedback network 270.

In accordance with an embodiment of the invention, a third input on connection 232 is supplied to the operational amplifier 300 by the voltage clamp reference circuit 212 and is referred to as $V_{CLAMP}$.

The voltage clamp reference circuit 212 comprises an operational amplifier 244 that mirrors the operation of the operational amplifier 300 in the voltage regulator 260. The non-inverting input 238 of the operational amplifier 244 is coupled to a voltage source 234 having a voltage of $V_{ENV(MAX)}$. The output of the operational amplifier 244 is supplied via connection 224 to the feedback network 252. The feedback network 252 also has the transfer function H($V_{ENV}$). The output of the operational amplifier 244 is also supplied via connection 224 to the inverting input of the operational amplifier 220. The operational amplifier 220 is also referred to as an "error amplifier."

The third input 232 to the operational amplifier 244 is taken from the output of the operational amplifier 220. The non-inverting input 222 of the operational amplifier 220 is coupled to a voltage source 216 providing a constant voltage drop, $V_{(DROP)}$ from $V_{BATT}$ 214.

The power added efficiency (PAE) of the power amplifier 180 is given by Equation 2, where $P_I$ is the input power to the power amplifier at connection 184 and $I_{BATT}$ is the total battery current draw of the power amplifier 180 and the power amplifier control module 210.

$$PAE = \frac{P_O - P_I}{V_{BATT} * I_{BATT}} \quad \text{(Eq. 2)}$$

At, maximum power, where maximum efficiency is desired, $P_O \gg P_I$ and $V_{CC}$ is much greater than $V_{CE(sat)}$, so equation 2 reduces to Equation 3.

$$PAE \cong \frac{V_{CC}^2}{2R_L * (V_{BATT} * I_{BATT})} \quad \text{(Eq. 3)}$$

Equation 3 shows that maximum efficiency is achieved by making the voltage $V_{CC}$ on connection 168 as large as possible for a given battery voltage $V_{BATT}$. In the power amplifier control module 210, the voltage $V_{CC}$ on connection 168 is generated by a linear voltage regulator 260, which typically comprises an op amp 300, a PFET 262 capable of sourcing the collector current of the power amplifier 180 and a feedback network 270 that sets the relationship between $V_{ENV}$ on connection 146 and $V_{CC}$ on connection 168. Since $V_{CC}$ is set by the transfer function of the feedback network 270, the loop gain is preferably high to maintain regulation, requiring the transistor 262 to operate in a saturation mode, where $$V_{BATT} - V_{CC} > V_{DS(sat)}. \quad \text{(Eq. 4)}$$

Under normal operating conditions, a nominal value of battery voltage, $V_{BATT(nom)}$, is selected and the power amplifier module 200 is designed to provide the maximum output power at a maximum power added efficiency while maintaining regulation of the linear voltage regulator 260. This is accomplished by designing the transfer function H($V_{ENV}$) of the feedback network 270 such that $V_{CC}$ at $V_{ENV(max)}$ is as close to $V_{BATT(nom)}$ as possible while maintaining voltage regulation.

During use of a battery powered device, such as a portable cellular communication device, the battery voltage will drop as charge is drained from the battery, so the power amplifier module is typically specified to operate over a range of battery voltages. Since the power amplifier 180 is designed for optimal performance at $V_{BATT(nom)}$, when $V_{BATT} < V_{BATT(nom)}$, Equation 4 will be violated and $V_{CC}$ will no longer be regulated, so the relationship $V_{CC}$=H($V_{ENV}$) is no longer satisfied. This is illustrated in a pulsed-waveform system such as GSM by applying a sinusoid with a magnitude of $V_{ENV(max)}$ on connection 146 as the $V_{ENV}$ signal, with $V_{BATT} < V_{BATT(nom)}$ applied to connection 214. This will be explained below in FIG. 4.

Figure 3:
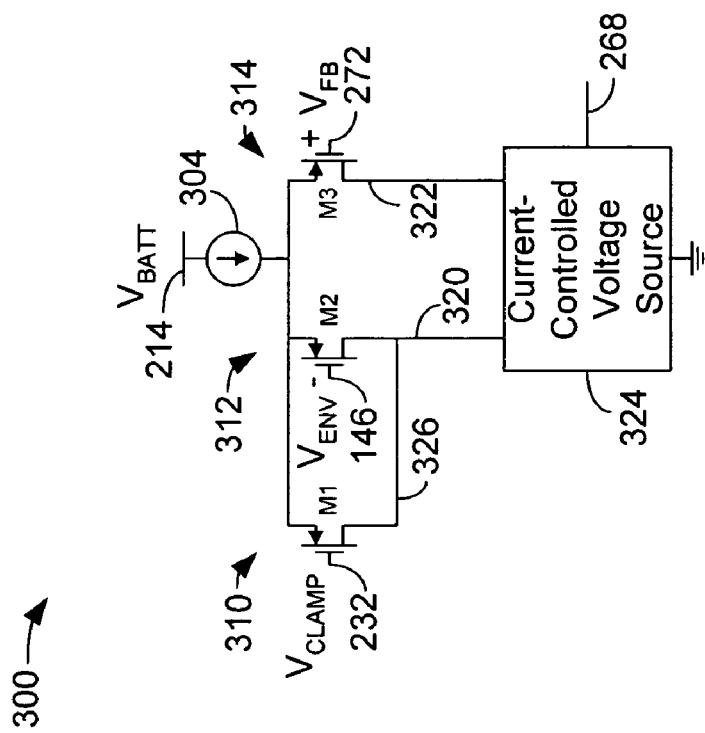
FIG. 3 is a schematic diagram illustrating an embodiment of the invention implemented in the operational amplifier of FIG. 2.

FIG. 3 is a schematic diagram illustrating an embodiment of the invention implemented using the operational amplifier 300 of FIG. 2. To provide a "soft" clamping characteristic, the operational amplifier 300 in the voltage regulator 260 includes a third input transistor 310 (PFET in this embodiment) coupled in parallel with the inverting input transistor 312 and in addition to the non-inverting input transistor 314. A current source 304 biases the transistors 310, 312, and 314 and is connected between $V_{BATT}$ 214 and the source terminals of transistors 310, 312 and 314. The drain terminal of transistor 310 is coupled via connection 326 to connection 320, the drain terminal of transistor 312 is coupled via connection 320 to subsequent stages of the operational amplifier (300 of FIG. 2), modeled by a current controlled voltage source 324. The drain terminal 322 of transistor 314 is coupled to the current controlled voltage source 324. The output of the current controlled voltage source 324 is the output 268 which is supplied to the gate terminal of the transistor 262 of FIG. 2. Using the configuration shown in FIG. 3, the gate terminal 232 of transistor 310 is connected to the reference voltage $V_{CLAMP}$, the gate terminal 146 of transistor 312 is connected to $V_{ENV}$, and the gate terminal 272 of transistor 314 is connected to the output $V_{FB}$ of the feedback network 270 (FIG. 2). As will be described below, the additional input transistor 310 is controlled by the voltage $V_{CLAMP}$ to provide a soft switching function when the battery voltage $V_{BATT}$ drops below the value $V_{BATT(nom)}$.

Figure 4:
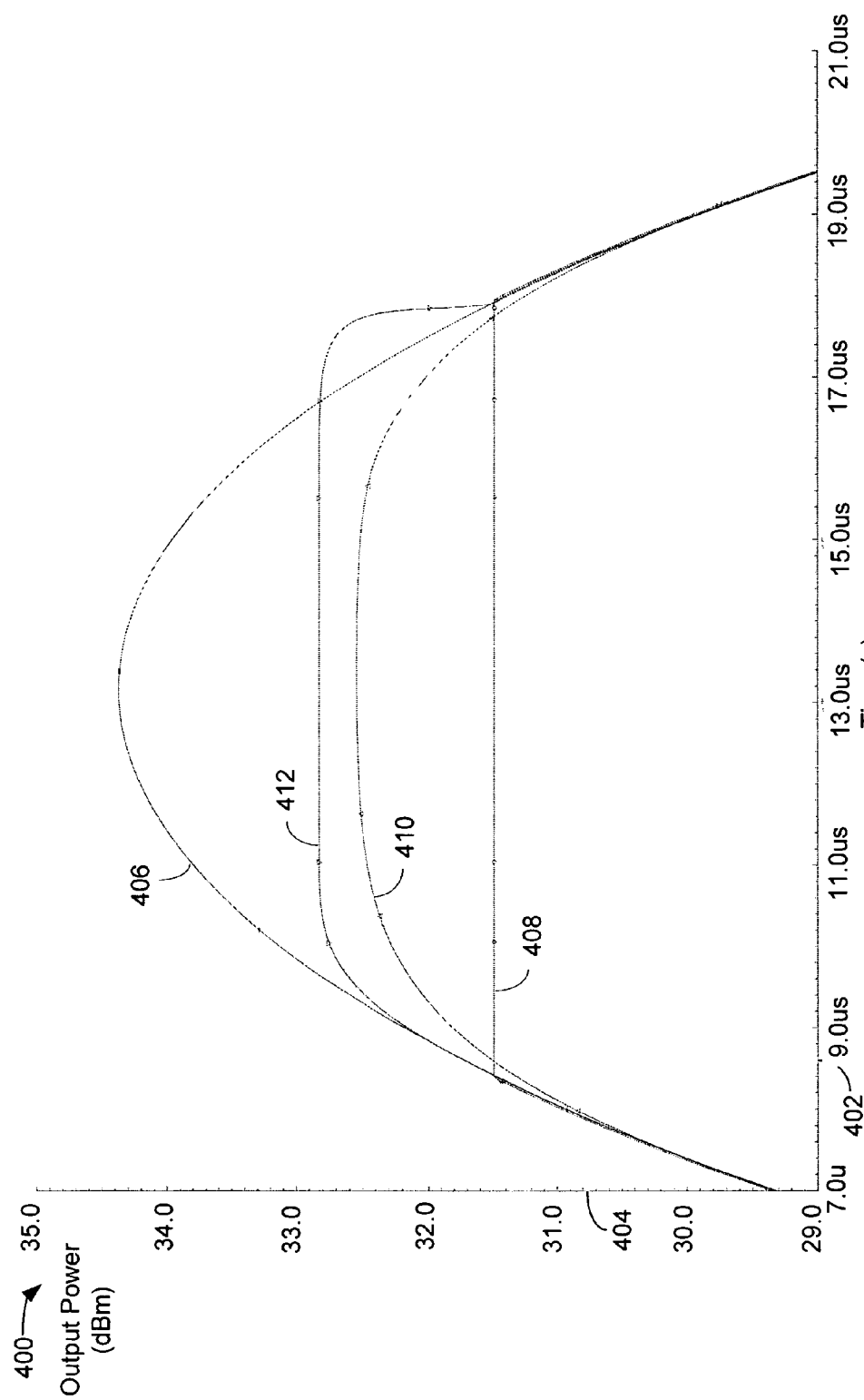
FIG. 4 is a graphical diagram illustrating the transient response of the power amplifier module under clamped and unclamped conditions.

FIG. 4 is a graphical diagram 400 illustrating the transient response of the power amplifier module under clamped and unclamped conditions. The horizontal axis 402 represents time (s), while the vertical axis 404 represents the output of the power amplifier 180 in dBm.

The curve 406 represents the transient response of the power amplifier 180 with the nominal battery voltage $V_{BATT}$ (nom), the curve 412 represents the transient performance of the power amplifier with a reduced battery voltage and no voltage clamp, the curve 408 represents the transient response of the power amplifier 180 with a reduced battery voltage using a "hard" voltage clamp, and the curve 410 represents the transient response of the power amplifier 180 with a reduced battery voltage using a "soft" clamp. The non-regulating region occurs where the output response of the power amplifier 180 departs from the nominal response shown by curve 406. The non-regulating region indicates that the feedback loop of the voltage regulator 260 is open.

When $V_{ENV}$ drops to a level where Equation 4 is satisfied, the regulator loop is closed, making $V_{CC}$=H($V_{ENV}$) again valid. However, since the bandwidth of the control loop 270 is finite, there is a time delay in closing the feedback loop so the voltage regulator 260 is forced to abruptly slew to reacquire the correct output voltage, as shown by curve 412 in FIG. 4. This abrupt transition generates spectral content levels which are unacceptable for meeting switching transient specifications for some time division multiple access (TDMA) systems such as GSM. In addition, when the amplifier is used for polar modulation under reduced battery voltage with either no voltage clamp or a "hard" voltage clamp, the peaks of the modulation envelope will display the same abrupt transition as the switching response, generating modulation spectra which exceed some specifications. The "soft" voltage clamp significantly reduces the high frequency spectra of the modulation under reduced battery voltage, allowing polar modulation at a higher output power than an unclamped or "hard" clamped amplifier.

To reduce the spectral content due to switching transients, the output of the voltage regulator 260 is limited in accordance with an embodiment of the invention to maintain the output signal of the power amplifier on connection 156 from making an abrupt transition. If a hard limit is placed on the output of the voltage regulator 260, the limit level is preferably set sufficiently low to avoid the non-regulating region, as shown by curve 408, or an abrupt transition will occur, generating undesirable spectral regrowth. By setting the limit of the voltage regulator 260 sufficiently low to avoid operating the power amplifier 180 in the non-regulating region, the attainable output power is further reduced. Some reduction in output power is unavoidable when $V_{BATT}$ is reduced below $V_{CC(nom)}$, as shown by curve 412, adversely affecting the allowable transmission distance and power added efficiency of the portable device.

Figure 5:
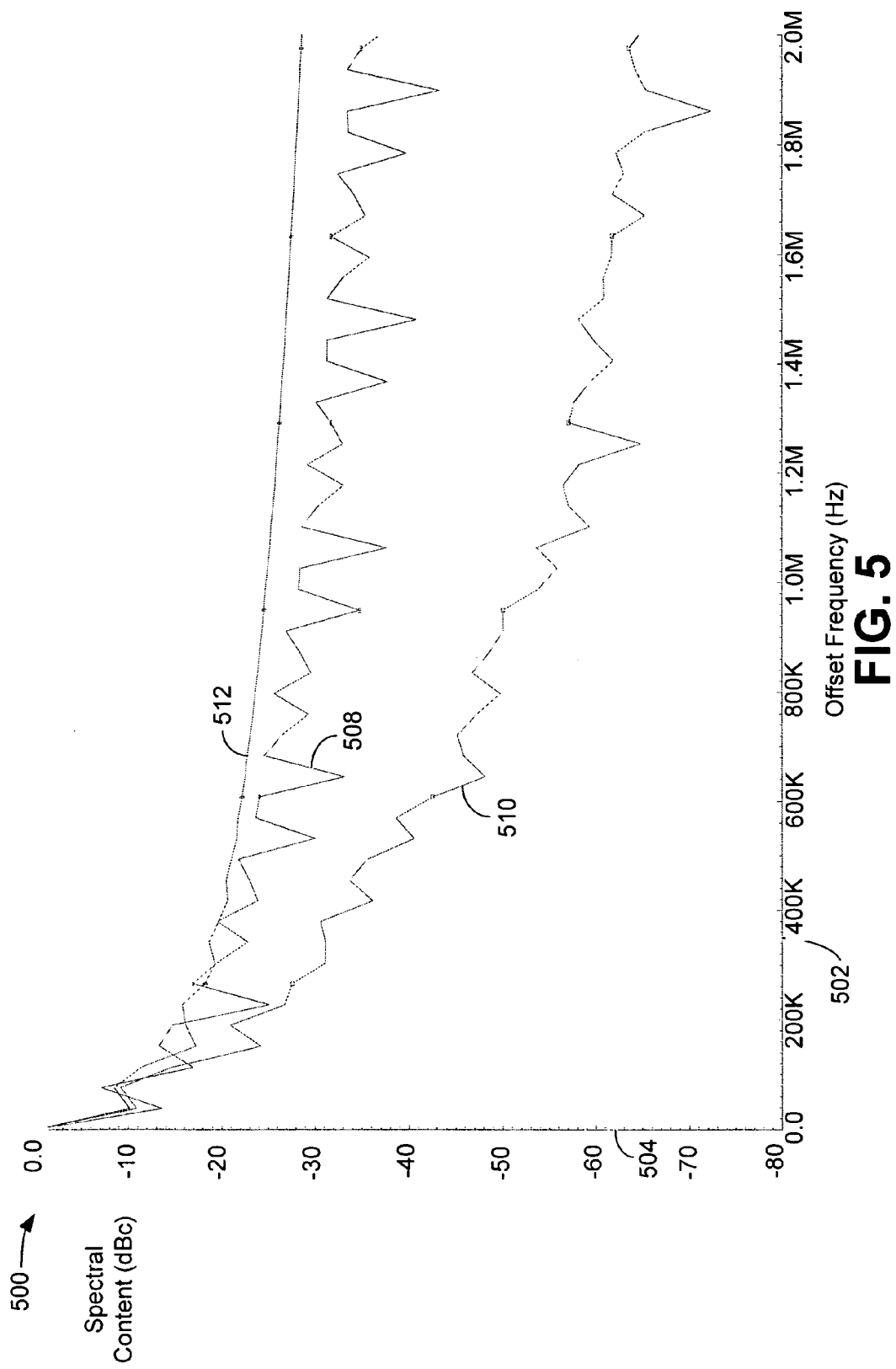
FIG. 5 is a graphical diagram illustrating the spectral regrowth (spectral content) of the output of the power amplifier module under different voltage clamping profiles.

FIG. 5 is a graphical diagram 500 illustrating the spectral regrowth (spectral content) of the output of the power amplifier 180 under different voltage clamping profiles. The horizontal axis 502 represents offset frequency in hertz (Hz), and the vertical axis 504 represents spectral content in (dBc). Curve 512 shows the fast fourier transform (FFT) of an unclamped response corresponding to curve 412, curve 508 shows the FFT produced by the hard clamping corresponding to curve 408 of FIG. 4, while the curve 510 shows the FFT produced by a soft clamping mechanism, corresponding to curve 410 of FIG. 4.

As shown in FIG. 5, the abrupt transition of the unclamped response with a reduced battery voltage produces significant spectral content. The hard limit shown by curve 408 of FIG. 4 not only reduces power added efficiency, but the spectral regrowth produced by such a profile, shown by curve 508, is not significantly better than the spectral regrowth produced by the unclamped profile shown by curve 512. The soft clamping mechanism smoothes the transition from non-regulation to regulation, significantly reducing the switching transient spectra as shown by curve 510, while providing higher output power and power added efficiency than the hard clamped voltage regulator.

Figure 6:
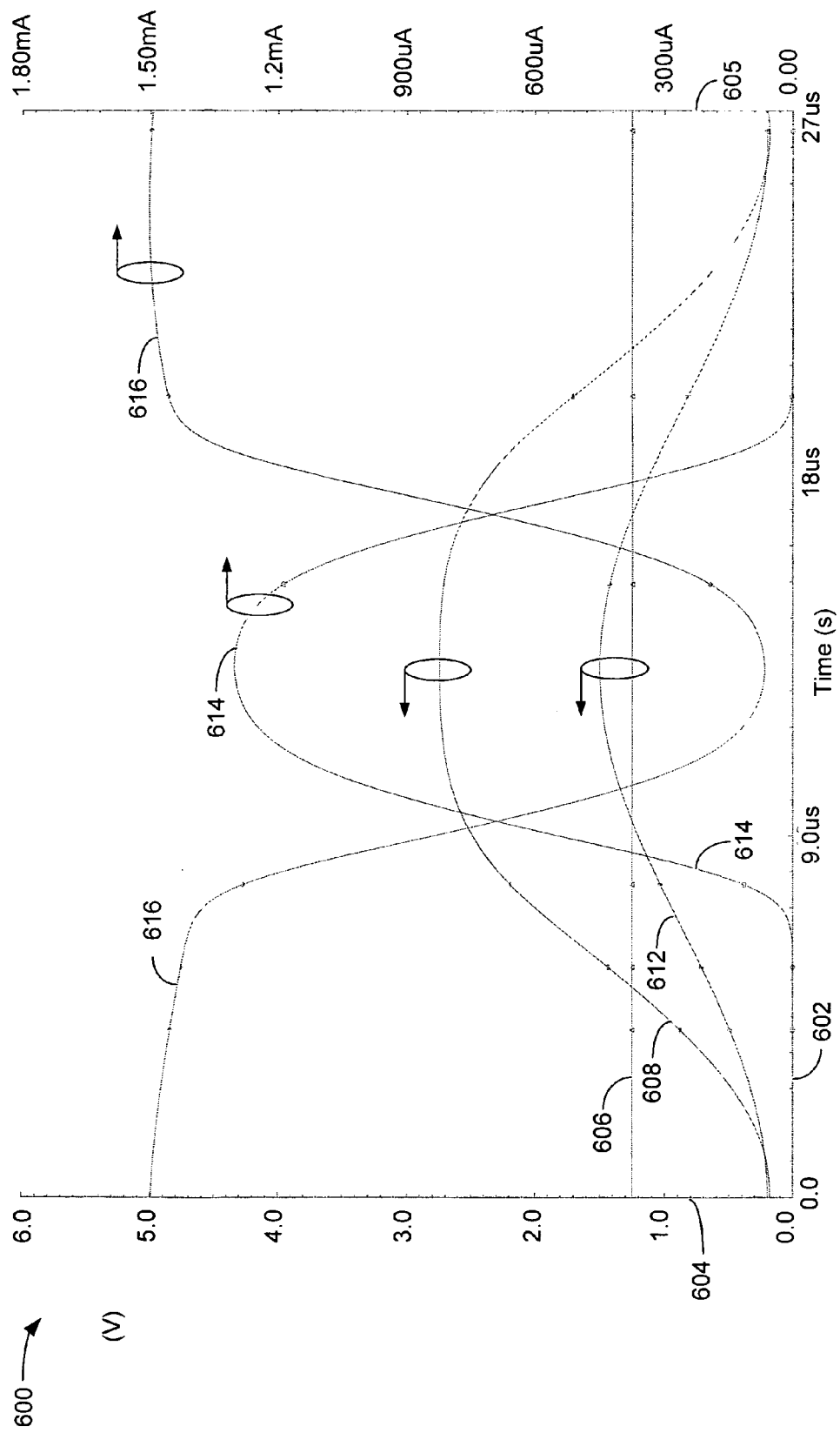
FIG. 6 is a graphical diagram illustrating the relationship of the various voltages and the drain current of the transistors of FIG. 3.

FIG. 6 is a graphical diagram 600 illustrating the relationship of the various voltages and the drain currents of transistors 310 and 312 of FIG. 3. The horizontal axis 602 represents time(s), the left hand vertical axis 604 represents voltage (V) and the right hand vertical axis 605 represents current (A). The curve 606 represents the voltage $V_{CLAMP}$, the curve 608 represents the voltage $V_{CC}$, the curve 612 represents the voltage $V_{ENV}$, the curve 614 represents the drain current of the transistor 310, and the curve 616 represents the drain current of the transistor 312. The curves 606, 608 and 612 refer to the left hand vertical axis 604 and the curves 614 and 616 refer to the right hand vertical axis 605.

Referring now to FIGS. 3 and 6, under nominal conditions ($V_{BATT} \geq V_{BATT(nom)}$), $V_{CLAMP}$ is set at a level greater than $V_{ENV(MAX)}$, so the current through transistor 310 (curve 614) is minimal compared to the current through transistor 312 (curve 616). However as $V_{BATT}$ drops, $V_{CLAMP}$ also drops, eventually to a level below $V_{ENV(MAX)}$. When $V_{ENV} > V_{CLAMP}$, the current flowing through transistor 312 is diverted to transistor 310, so excursions of $V_{ENV}$ above $V_{CLAMP}$ result in little to no change in the current output through connection 320 (FIG. 3) to the following stages of the operational amplifier 300, modeled by the current-controlled voltage source 324. When $V_{ENV}$ is reduced to a level below $V_{CLAMP}$, the current is diverted back to transistor 312, so the current through connection 320 is again controlled by $V_{ENV}$, and $V_{CC}$ on connection 168 assumes the transfer function defined by $H(V_{ENV})$. Since the current differential between transistors 310 and 312 is dependent upon the voltage differential between $V_{ENV}$ and $V_{CLAMP}$, the transfer of current between transistors 310 and 312 occurs gradually as $V_{ENV}$, shown at 612, gradually approaches $V_{CLAMP}$, shown at 606, providing the "soft" clamping characteristic.

In one embodiment, the voltage $V_{CLAMP}$ is generated using the voltage clamp reference circuit 212 as shown in FIG. 2. The operational amplifier 244 and an associated feedback network 252 are used to replicate the voltage regulator 260. A third input PFET, not shown, is included in the operational amplifier 244 to emulate the clamp transistor 310 shown in operational amplifier 300 in FIG. 3. Using a bias voltage locally generated by voltage source 234, the non-inverting input 238 of operational amplifier 244 is connected to a voltage equal to $V_{ENV(max)}$, thus replicating the voltage regulator 260 at full power amplifier power.

Using a locally-generated voltage source 216 coupled to the voltage $V_{BATT}$ on connection 214, a constant voltage drop from $V_{BATT}$, referred to as $V_{DROP}$, is generated. This voltage drop is equivalent to the desired drain-source voltage $V_{DS}$ across the transistor 262 on connection 168, used to maintain a smooth switching response in the voltage regulator 260. The resultant voltage, $V_{BATT}-V_{DROP}$ is connected to the non-inverting input 222 of operational amplifier 220 (FIG. 2). The inverting input 224 of operational amplifier 220 is connected to the output of the operational amplifier 244 on connection 224. Because the operational amplifiers 244 and 220 are connected in a feedback loop, the operational amplifier 220 adjusts the voltage $V_{CLAMP}$ on connection 232 such that the output voltage of the operational amplifier 244 is equal to $V_{BATT}-V_{DROP}$. Therefore, as $V_{BATT}$ drops from a nominal level, the voltage $V_{CLAMP}$ is adjusted to ensure that the voltage drop $V_{DS}$ across the transistor 262 (FIG. 2) is always greater than $V_{DROP}$.

As shown in FIG. 2, in one embodiment, the clamp reference voltage $V_{CLAMP}$ is generated independently of the voltage regulator 260 requiring no feedback around the voltage regulator 260. This open-loop architecture allows the output to be clamped without affecting the bandwidth of the voltage regulator, making polar modulation in a clamped condition possible. Also, an open-loop architecture provides the "soft" clamping characteristic, since a feedback loop would cause a more abrupt transition of current between transistors 310 and 312 (FIG. 3), resulting in a sharper clamping profile, much like the undesirable curve 408 (FIG. 4).

Figure 7:
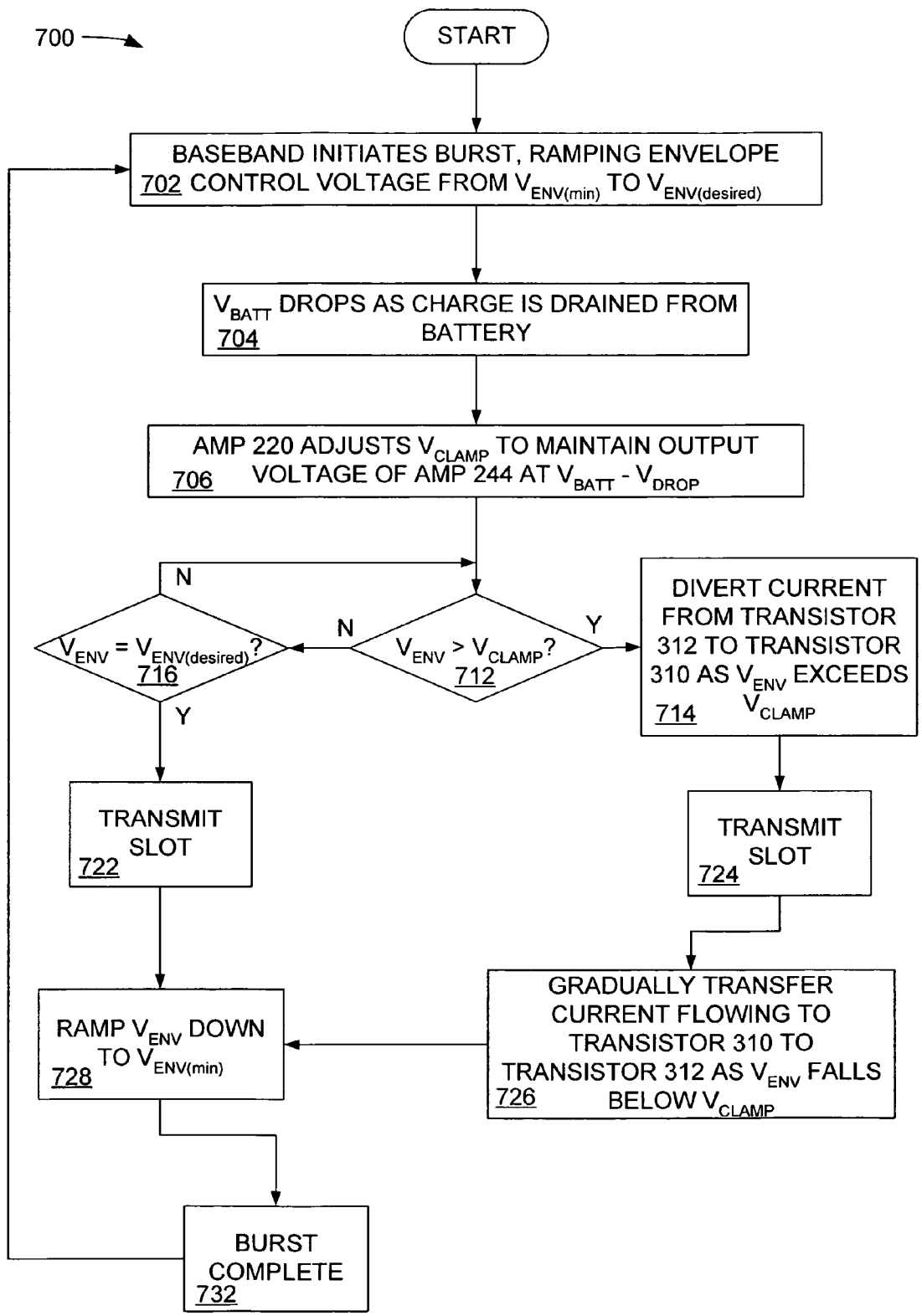
FIG. 7 is a flowchart describing the operation of one embodiment of the invention.

FIG. 7 is a flow chart illustrating the operation of an embodiment of the invention. The blocks in the flowchart can be performed in the order shown, out of the order shown, or can be performed in parallel. The power amplifier module 200 is preferably designed to operate at a voltage, $V_{BATT}$ (nom), to return maximum power added efficiency at a maximum designed power output. In block 702, the baseband subsystem 110 initiates a transmit burst, ramping the voltage $V_{ENV}$ from a voltage $V_{ENV(min)}$ to a voltage $V_{ENV}$ (desired), corresponding to the desired burst power. In block 704, as the portable communication device is used, charge is drained from the battery and the voltage, $V_{BATT}$ begins to drop, forcing the voltage at node 222 (FIG. 2) to drop accordingly.

In block 706, the error amplifier 220 adjusts the voltage $V_{CLAMP}$ to maintain the output voltage of operational amplifier 244 at the voltage $V_{BATT}-V_{DROP}$. In block 712 it is determined whether $V_{ENV}$ is greater than $V_{CLAMP}$. If, in block 712, it is determined that $V_{ENV}$ is greater than $V_{CLAMP}$, then, in block 714, current is diverted from transistor 312 to transistor 310 (FIG. 3) as $V_{ENV}$ exceeds $V_{CLAMP}$, thus gradually limiting $V_{CC}$ at $V_{BATT}-V_{DROP}$. If, in block 712, it is determined that $V_{ENV}$ is less than $V_{CLAMP}$, then, in block

716, it is determined whether $V_{ENV}$ is at the desired voltage $V_{ENV(desired)}$. If $V_{ENV}$ is not at the desired voltage, then, normal power ramp-up is continued and the process returns to block 712. If $V_{ENV}$ is at the desired voltage, then, in block 722, the transmit slot is initiated. Similarly, after the current is diverted from transistor 312 to transistor 310 (FIG. 3) as $V_{ENV}$ exceeds $V_{CLAMP}$, in block 714, the transmit slot is initiated in block 724.

In block 726, after the transmit slot, the current flowing through transistor 310 is gradually transferred back to transistor 312, as $V_{ENV}$ is reduced below $V_{CLAMP}$. The process then proceeds to block 728, where the voltage $V_{ENV}$ is ramped down to $V_{ENV(min)}$. After the transmit slot in block 722, the process then proceeds to block 728, where the voltage $V_{ENV}$ is ramped down to $V_{ENV(min)}$. In block 732 the transmit burst is complete and the process returns to block 702 for the next transmit burst.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

A power control circuit for a power amplifier comprises a voltage regulator having a first input configured to receive a envelope control signal, a second input configured to receive a feedback signal, and a third input configured to receive a voltage clamp signal; and a voltage clamp reference circuit configured to generate the voltage clamp signal.

What is claimed is:

1. A method for dynamically controlling an envelope and power output of a power amplifier, comprising:
   providing a radio frequency (RF) signal to a power amplifier;
   generating an envelope control signal;
   generating a voltage clamp signal;
   generating a regulated voltage, the regulated voltage related to the envelope control signal;
   supplying the regulated voltage to the power amplifier; and
   controlling the output of the power amplifier according to the regulated voltage, wherein the regulated voltage is responsive to an envelope control signal and the voltage clamp signal.

2. The method of claim 1, further comprising preventing the regulated voltage from being responsive to a signal other than the voltage clamp signal when the envelope control signal exceeds a level of the voltage clamp signal.

3. The method of claim 2, further comprising controlling the transition of the regulated voltage from being responsive to the envelope control signal to being responsive to the voltage clamp signal to minimize power supply switching transients.

4. The method of claim 3, further comprising gradually transitioning the regulated voltage between being responsive to the envelope control signal to being responsive to the voltage clamp signal.

5. The method of claim 3, further comprising generating the voltage clamp signal by mirroring the output of a voltage regulator configured to supply the regulated voltage.

6. A power control circuit for a power amplifier, comprising:
   a voltage regulator having a first input configured to receive an envelope control signal, a second input configured to receive a feedback signal, and a third input configured to receive a voltage clamp signal; and
   a voltage clamp reference circuit configured to generate the voltage clamp signal.

7. The power control circuit of claim 6, wherein the voltage regulator further comprises:
   a first operational amplifier comprising a first transistor configured to receive the envelope control signal, a second transistor configured to receive the feedback signal and a third transistor configured to receive the voltage clamp signal, wherein when the envelope control signal is less than the voltage clamp signal, the first transistor and the second transistor form a first input pair of the operational amplifier, and wherein when the envelope control signal approaches the voltage clamp signal, current flowing in the first transistor is diverted to the second transistor, so that the second transistor and the third transistor form a second input pair of the operational amplifier.

8. The power control circuit of claim 7, wherein a transition between an operating state where the first transistor and the second transistor form a first input pair to an operating state where the second transistor and the third transistor form a second input pair is gradual.

9. The power control circuit of claim 8, further comprising a transistor at the output of the operational amplifier, the transistor configured to generate a regulated voltage signal.

10. The power control circuit of claim 7, wherein the regulated voltage signal closely follows the envelope control signal until a desired regulated voltage signal exceeds a battery voltage level.

11. The power control circuit of claim 10, wherein the regulated voltage signal is responsive to the envelope control signal until the envelope control signal exceeds the voltage clamp signal.

12. The power control circuit of claim 11, wherein the regulated voltage signal is responsive to the voltage clamp signal when the envelope control signal exceeds the voltage clamp signal.

13. The power control circuit of claim 11, wherein the voltage clamp reference circuit comprises:
   a first operational amplifier and feedback network configured to mirror a transfer function and clamping characteristic of the voltage regulator; and
   a second operational amplifier configured to adjust the voltage clamp signal such that the output voltage of the first operational amplifier is equal to $V_{BATT}-V_{DROP}$ as $V_{BATT}$ drops from a nominal level, and such that a voltage drop $V_{DS}$ across a transistor at an output of the voltage regulator is always greater than $V_{DROP}$.

14. A portable transceiver, comprising:
   a transceiver capable of transmitting and receiving a radio frequency (RF) signal;
   a voltage regulator having a first input configured to receive an envelope control signal, a second input configured to receive a feedback signal, and a third input configured to receive a voltage clamp signal; and
   a voltage clamp reference circuit configured to generate the voltage clamp signal.

15. The portable transceiver of claim 14, wherein the voltage regulator further comprises:
   a first operational amplifier comprising a first transistor configured to receive the envelope control signal, a second transistor configured to receive the feedback signal and a third transistor configured to receive the voltage clamp signal, wherein when the envelope control signal is less than the voltage clamp signal, the first transistor and the second transistor form a first input pair of the operational amplifier, and wherein when the envelope control signal approaches the voltage clamp signal, current flowing in the first transistor is diverted to the second transistor, so that the second transistor and the third transistor form a second input pair of the operational amplifier.

16. The portable transceiver of claim 15, wherein a transition between an operating state where the first transistor and the second transistor form a first input pair to an operating state where the second transistor and the third transistor form a second input pair is gradual.

17. The portable transceiver of claim 16, further comprising a transistor at the output of the operational amplifier, the transistor configured to generate a regulated voltage signal.

18. The portable transceiver of claim 17, wherein the regulated voltage signal is responsive to the envelope control signal until a desired regulated voltage signal exceeds a battery voltage level.

19. The portable transceiver of claim 18, wherein the regulated voltage signal closely follows the envelope control signal until the envelope control signal exceeds the voltage clamp signal.

20. The portable transceiver of claim 19, wherein the regulated voltage signal is responsive to the voltage clamp signal when the envelope control signal exceeds the voltage clamp signal.

21. The power control circuit of claim 19, wherein the voltage clamp reference circuit comprises:
  a first operational amplifier and feedback network configured to mirror a transfer function and clamping characteristic of the voltage regulator; and
  a second operational amplifier configured to adjust the voltage clamp signal such that the output voltage of the first operational amplifier is equal to $V_{BATT}-V_{DROP}$ as $V_{BATT}$ drops from a nominal level, and such that a voltage drop $V_{DS}$ across a transistor at an output of the voltage regulator is always greater than $V_{DROP}$.

22. A portable transceiver, comprising:
  means for transmitting and receiving a radio frequency (RF) signal;
  voltage regulator means having a first input configured to receive an envelope control signal, a second input configured to receive a feedback signal, and a third input configured to receive a voltage clamp signal; and
  means for generating the voltage clamp signal.

23. The portable transceiver of claim 22, wherein the voltage regulator means further comprises:
  first operational amplifier means comprising a first transistor configured to receive the envelope control signal, a second transistor configured to receive the feedback signal and a third transistor configured to receive the voltage clamp signal, wherein when the envelope control signal is less than the voltage clamp signal, the first transistor and the second transistor form a first input pair of the operational amplifier, and wherein when the envelope control signal approaches the voltage clamp signal, current flowing in the first transistor is diverted to the second transistor, so that the second transistor and the third transistor form a second input pair of the operational amplifier.

24. The portable transceiver of claim 23, further comprising means for providing a smooth transition between an operating state where the first transistor and the second transistor form a first input pair to an operating state where the second transistor and the third transistor form a second input pair.

25. The portable transceiver of claim 24, further comprising means for generating the voltage clamp signal by mirroring a transfer function and clamping characteristic of a voltage regulator configured to supply the regulated voltage.

* * * * *